(12) United States Patent
Ye et al.

(10) Patent No.: US 9,761,562 B2
(45) Date of Patent: Sep. 12, 2017

(54) SEMICONDUCTOR DEVICE PACKAGES INCLUDING A CONTROLLER ELEMENT

(71) Applicant: Micron Technology, Inc., Boise, ID (US)

(72) Inventors: Seng Kim Dalson Ye, Singapore (SG); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 165 days.

(21) Appl. No.: 14/705,274

(22) Filed: May 6, 2015

(65) Prior Publication Data

US 2016/0329303 A1    Nov. 10, 2016

(51) Int. Cl.
| | |
|---|---|
| *H01L 21/48* | (2006.01) |
| *H01L 23/13* | (2006.01) |
| *H01L 25/065* | (2006.01) |
| *H01L 25/00* | (2006.01) |
| *H01L 23/498* | (2006.01) |
| *H01L 23/50* | (2006.01) |

(52) U.S. Cl.
CPC .......... *H01L 25/0657* (2013.01); *H01L 23/13* (2013.01); *H01L 23/49827* (2013.01); *H01L 25/50* (2013.01); *H01L 23/49811* (2013.01); *H01L 23/49822* (2013.01); *H01L 23/50* (2013.01); *H01L 2224/48137* (2013.01); *H01L 2224/48147* (2013.01); *H01L 2225/0651* (2013.01); *H01L 2225/06524* (2013.01); *H01L 2225/06555* (2013.01); *H01L 2924/15311* (2013.01)

(58) Field of Classification Search
CPC ......... H01L 25/50; H01L 23/13; H01L 23/49; H01L 23/498; H01L 23/4981; H01L 23/49811; H01L 23/4982; H01L 23/49822; H01L 23/49827; H01L 23/50; H01L 21/48; H01L 21/484; H01L 21/485; H01L 21/4846; H01L 21/4853
USPC ........................................................ 257/314
See application file for complete search history.

(56) References Cited

U.S. PATENT DOCUMENTS

| | | |
|---|---|---|
| 7,732,908 B2 | 6/2010 | Nishiyama et al. |
| 7,867,819 B2 | 1/2011 | Upadhyayula et al. |
| 7,994,643 B2 | 8/2011 | Kwon et al. |

(Continued)

*Primary Examiner* — Monica D Harrison
(74) *Attorney, Agent, or Firm* — TraskBritt (57) ABSTRACT

Semiconductor device packages include a stack of semiconductor memory devices positioned over an interposer substrate, a controller element, and a redistribution substrate positioned laterally adjacent to the controller element. At least a portion of the controller element is positioned directly between the stack and the interposer substrate. The controller element is operatively connected to the semiconductor memory devices of the stack through the redistribution substrate and the interposer substrate. Methods of manufacturing a semiconductor device package include positioning a redistribution substrate laterally adjacent to a controller element and attaching the redistribution substrate and the controller element to an interposer substrate. A stack of semiconductor memory devices is positioned over the controller element and the redistribution substrate. The controller element is operatively connected to the semiconductor memory devices of the stack through the redistribution substrate and the interposer substrate.

16 Claims, 5 Drawing Sheets

(56) References Cited

U.S. PATENT DOCUMENTS

| | | | |
|---|---|---|---|
| 8,030,748 B2 | 10/2011 | Ye et al. | |
| 8,053,881 B2 * | 11/2011 | Kim | H01L 21/563 |
| | | | 257/686 |
| 8,174,101 B2 | 5/2012 | Lee et al. | |
| 8,232,631 B2 * | 7/2012 | Cho | H01L 21/6835 |
| | | | 257/686 |
| 8,507,318 B2 | 8/2013 | Ye et al. | |
| 8,519,523 B2 | 8/2013 | Ye et al. | |
| 8,587,088 B2 | 11/2013 | Seroff | |
| 8,637,987 B2 | 1/2014 | Chong et al. | |
| 8,723,303 B2 | 5/2014 | Nasu et al. | |
| 8,780,600 B2 | 7/2014 | Fai et al. | |
| 8,791,558 B2 | 7/2014 | Bae et al. | |
| 8,803,306 B1 * | 8/2014 | Yu | H01L 21/78 |
| | | | 257/686 |
| 8,823,159 B2 | 9/2014 | Ye et al. | |
| 8,923,004 B2 | 12/2014 | Low et al. | |
| 2007/0263425 A1 | 11/2007 | Ruckerbauer | |
| 2014/0363923 A1 | 12/2014 | Cho et al. | |

* cited by examiner

SEMICONDUCTOR DEVICE PACKAGES INCLUDING A CONTROLLER ELEMENT

FIELD

Embodiments of the present disclosure relate to semiconductor device packages including at least a controller element and semiconductor memory devices stacked over the controller element. Further embodiments of the present disclosure relate to methods of manufacturing such semiconductor device packages.

BACKGROUND

The market for mobile devices, personal computers, laptop computers, so-called "all-in-one" computers, data storage devices, and other electronic devices has driven a demand for smaller, higher capacity, and more reliable semiconductor devices such as memory devices, processors, and controllers. Multi-chip packages have been developed in an attempt to meet the market demands by combining multiple semiconductor devices into a single semiconductor device package.

Some semiconductor device packages include multiple types of semiconductor devices, such as non-volatile memory (e.g., NAND Flash memory) devices and a controller element. Such semiconductor device packages may include a controller element underlying a stack of non-volatile memory devices, a controller element over a stack of non-volatile memory devices, or a controller element laterally adjacent to a stack of non-volatile memory devices. Each of these arrangements offers benefits as well as challenges in terms of manufacturability, cost, performance, reliability, and area savings.

For example, in existing semiconductor device packages that include a controller element underlying a stack of non-volatile memory devices, the controller element may be embedded within an interposer substrate, within a cavity opening in the interposer substrate, or between the stack and the interposer substrate. In packages with the controller element embedded within the interposer substrate, the substrate vendor is relied on to embed the controller, adding to the cost of the substrate. In packages with the controller element within a cavity opening in the interposer substrate, it may be difficult to achieve a desired cavity depth within the substrate, and there may be challenges associated with a dielectric film for attaching the stack of non-volatile memory devices covering the cavity opening. In packages with the controller element between the stack and the interposer substrate, a dielectric film for adhering the stack over the controller element may squeeze out during assembly and curing, since the film is provided with additional thickness to accommodate the controller element and to cover wire bonds to the controller element.

By way of another example, in existing semiconductor device packages that include a controller element over the stack of non-volatile memory devices, long wire bonds used to provide electrical access to the controller element may deform during encapsulation, increasing the risk of forming electrical shorts to adjacent wire bonds or to the non-volatile memory devices. In addition, the wire bonds to the controller element may be close to a top of the encapsulant, increasing a risk of exposing the wire bond, such as upon laser marking the package.

By way of another example, in existing semiconductor device packages that include a controller element adjacent to the stack of non-volatile memory devices, the area that the package covers is increased, which is not suitable for some applications.

Accordingly, improved semiconductor device packages that provide benefits while reducing associated challenges are disclosed herein.

DETAILED DESCRIPTION

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques and materials employed in the industry.

The fabrication processes described herein do not describe a complete process flow for manufacturing semiconductor device packages. The remainder of the process flow is known to those of ordinary skill in the art. Accordingly, only the methods and structures necessary for one of ordinary skill in the art to understand embodiments of the present disclosure are described herein.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, material, sequential, and other changes may be made without departing from the scope of the disclosure. The illustrations presented herein are not meant to be actual views of any particular system, device, structure, or process, but are idealized representations, which are employed to describe the embodiments of the present disclosure. Similar structures or components in the various drawings may retain the same or similar numbering for the convenience of the reader; however, the similarity in numbering does not mean that the structures or components are necessarily identical in size, composition, configuration, or other property. The drawings presented herein are not necessarily drawn to scale. Indeed, some of the features of the devices and systems shown in the drawings are enlarged compared to other features, for clarity.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

As used herein, any relational term, such as "first," "second," "over," "top," "bottom," "lowermost," "overlying," "underlying," etc., is used for clarity and convenience in understanding the disclosure and accompanying drawings and does not connote or depend on any specific preference, orientation, or order, except where the context clearly indicates otherwise.

As used herein, the terms "lateral" and "laterally," with respect to a generally planar element such as a semiconductor die, refers to a direction in a plane in which the generally planar element lies. For example, from the perspective of FIG. 1, to the left, to the right, into the page, and out of the page are lateral directions with respect to the controller element 104 depicted therein.

The embodiments of the present disclosure include semiconductor device packages including stacked semiconductor memory devices and a controller element positioned between the stacked semiconductor memory devices and an interposer substrate. A redistribution substrate laterally adjacent to the controller element routes data from the controller element to bond pads proximate one or more lateral edges of the redistribution substrate, for convenient connection to bond pads of the interposer substrate.

Figure 1:
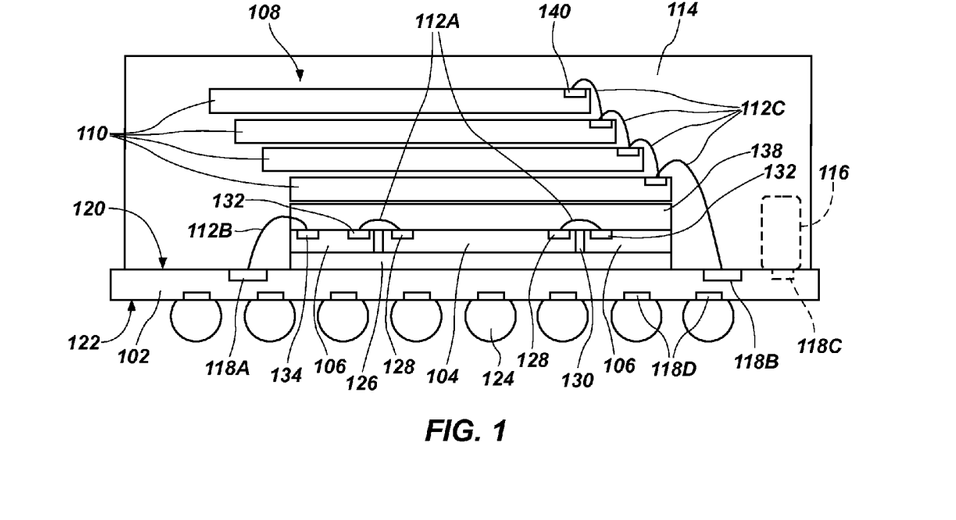
FIG. 1 shows a cross-sectional side view of a semiconductor device package according to an embodiment of the present disclosure.

Referring to FIG. 1, a cross-section of a semiconductor device package 100 according to the disclosure is shown. The semiconductor device package 100 may include an interposer substrate 102 (also referred to herein simply as an "interposer 102"), a controller element 104 (also referred to herein simply as a "controller 104") over the interposer substrate 102, a redistribution substrate 106 laterally adjacent to the controller element 104 and also over the interposer substrate 102, and a stack 108 of semiconductor memory devices 110 (e.g., non-volatile memory (NVM) devices, such as NAND Flash devices) over the controller element 104 and the redistribution substrate 106. Timer wire bonds 112A may electrically connect the controller 104 with the redistribution substrate 106, outer wire bonds 112B may electrically connect the redistribution substrate 106 to the interposer 102, and memory access wire bonds 112C may electrically connect the interposer 102 to the semiconductor memory devices 110 of the stack 108. The inner wire bonds 112A, outer wire bonds 112B, and memory access wire bonds 112C are collectively referred to herein as "wire bonds 112." By way of example and not limitation, the wire bonds 112 may comprise gold. The controller 104, redistribution substrate 106, stack 108 of semiconductor memory devices 110, and wire bonds 112 may be substantially encased in a dielectric encapsulant 114 to protect these features from environmental damage, to mechanically support these features, and to hold these features in place relative to the interposer 102. Optionally, the semiconductor device package 100 may also include at least one capacitor 116 (shown in FIG. 1 in dashed lines) over the interposer 102 and operatively connected to the controller 104 by way of the interposer 102. The at least one capacitor 116 may be encased in the dielectric encapsulant 114 or in a separate protective covering.

The interposer 102 may include various conductive elements configured and routed for operatively connecting to the controller 104, semiconductor memory devices 110, at least one capacitor 116 (if present), and a higher-level substrate (e.g., a printed circuit board) or other higher-level packaging. For example, first interposer bond pads 118A may be provided in a top surface 120 of the interposer 102 (i.e., a surface on the side of the interposer 102 closest to the controller 104 and stack 108 of semiconductor memory devices 110) for electrically connecting to the controller 104 by way of the redistribution substrate 106. Second interposer bond pads 118B may be provided in the top surface 120 of the interposer 102 for electrically connecting to the semiconductor memory devices 110. If the semiconductor device package 100 includes the at least one capacitor 116, at least one third interposer bond pad 118C may be provided for electrically connecting to the at least one capacitor 116. Fourth interposer bond pads 118D may be provided in a bottom surface 122 of the interposer 102 (i.e., a surface on a side of the interposer 102 opposite to the controller 104 and stack 108 of semiconductor memory devices 110) for electrical connection to conductive bumps 124 (e.g., solder balls), which may be arranged in a so-called "ball grid array" ("BGA"). The conductive bumps 124 may be provided for electrical connection to a higher-level substrate, as mentioned above. By way of example and not limitation, the bond pads 118A, 118B, 118C, and 118D may comprise gold. Additional features of the interposer 102 are described in further detail below with reference to FIG. 4.

The controller 104 and redistribution substrate 106 may be attached to the interposer 102 with an adhesive material, such as a die attach film ("DAF") 126. The controller 104 may be a semiconductor controller device for selecting individual semiconductor memory devices 110 of the stack 108 and for controlling data signals to and from the semiconductor memory devices 110 (e.g., signals for read, write, and erase operations). The controller 104 may include controller bond pads 128 for providing electrical access to and from the controller 104. The controller bond pads 128 may have a first pitch. The term "pitch" means a distance between similar points on adjacent, repeating, regularly spaced features. In other words, the first pitch of the controller bond pads 128 is equal to a width of a particular controller bond pad 128 added to a width of a space between the particular controller bond pad 128 and an adjacent controller bond pad 128. Stated another way, pitch may be described as the distance between centers of adjacent bond pads. By way of example and not limitation, the first pitch of the controller bond pads 128 may be between about 50 μm and about 80 μm, such as about 50 μm.

At least a portion of the controller 104 may be positioned directly between the stack 108 of the semiconductor memory devices 110 and the interposer 102. The controller 104 may cover a smaller area of the interposer 102 than one of the semiconductor memory devices 110. Accordingly, the controller 104 may, in some embodiments, be positioned fully directly beneath the stack 108 and between the stack 108 of the semiconductor memory devices 110 and the interposer 102. Stated another way, the stack 108 of semiconductor memory devices 110 may fully cover the controller 104. Thus, the arrangement of the components of the semiconductor device package 100 may be referred to as a "controller under stack" or "CUS" package. CUS packages may exhibit improved electrical and physical qualities (e.g., electrical performance, signal integrity, size, physical stability), in some respects, compared to other arrangements of packages including a controller and a stack of semiconductor memory devices (e.g., arrangements with the controller laterally adjacent to the stack or with the controller on the top of the stack).

Figures 2, 3:
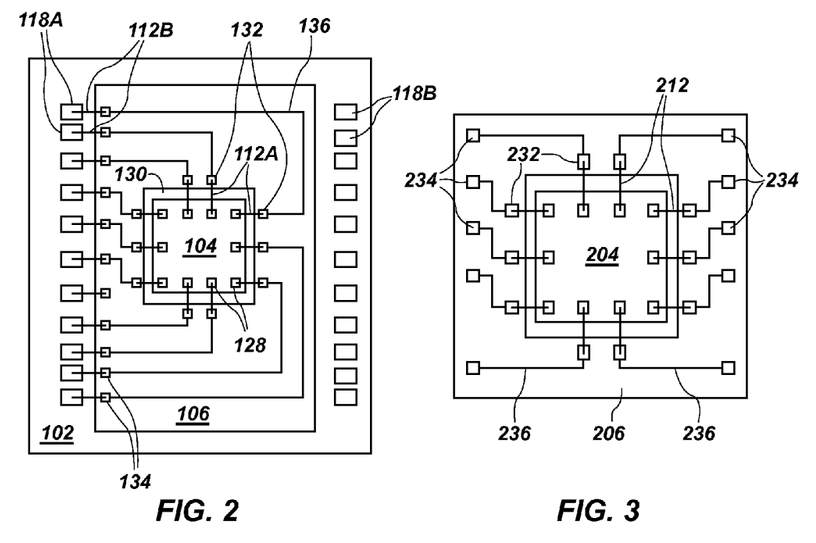
FIG. 2 shows a top view of a controller element, redistribution substrate, and interposer substrate of the semiconductor device package of FIG. 1.
FIG. 3 shows a top view of an alternative controller element and redistribution substrate.

Referring to FIGS. 1 and 2, the redistribution substrate 106 may be positioned laterally adjacent to the controller 104 over the interposer 102. The redistribution substrate 106 may at least partially laterally surround the controller 104, i.e., may be laterally adjacent to at least two lateral edges of the controller 104. As shown in FIG. 2, for example, the redistribution substrate 106 may fully laterally surround the controller 104. The redistribution substrate 106 may include a cavity, such as a through hole 130, sized and shaped for receipt of the controller 104 therein. A thickness of the redistribution substrate 106 may be selected to be substantially the same as a thickness of the controller 104. By way of example and not limitation, both the redistribution substrate 106 and the controller 104 may have a thickness of between about 35 μm and about 250 μm, such as between about 100 μm and about 210 μm. Further examples of redistribution substrates 106 and controller 104 thicknesses are about 70 μm, about 75 μm, and about 80 μm.

In some embodiments an outer peripheral size and shape of the redistribution substrate 106 may be substantially the same as an outer size and shape of a semiconductor memory device 110 of the stack 108. The redistribution substrate 106 may be substantially aligned with at least one of the semiconductor memory devices 110 of the stack 108 (e.g., a lowermost semiconductor memory device 110 of the stack 108), such that lateral edges of the redistribution substrate 106 are substantially coplanar with corresponding lateral edges of the at least one of the semiconductor memory devices 110 of the stack 108.

First redistribution bond pads 132 on the redistribution substrate 106 may be proximate the through hole 130, and may be provided for electrically connecting to the controller bond pads 128 through the inner wire bonds 112A. Due to space constraints proximate the controller 104, the first redistribution bond pads 132 may have a pitch that is substantially the same as or slightly larger than the first pitch of the controller bond pads 128. For example, the pitch of the first redistribution bond pads 132 may be between about 75 μm and about 130 μm. Second redistribution bond pads 134 on the redistribution substrate 106 may be positioned proximate one or more lateral edges of the redistribution substrate 106, and may be provided for electrically connecting to the first interposer bond pads 118A through the outer wire bonds 112B. The second redistribution bond pads 132 may also have a pitch of between about 75 μm and about 130 μm. In some embodiments, since there may be more space along the outer periphery of the redistribution substrate 106 for bond pads compared to along the through hole 130, the second redistribution bond pads 134 may have a second pitch that is greater than the first pitch of the controller bond pads 128. For example, the second pitch of the second redistribution bond pads 134 may be at least about 100 μm.

Conductive traces 136 on and/or in the redistribution substrate 106 may electrically connect the first redistribution bond pads 132 to respective second redistribution bond pads 134. Depending on the density (i.e., quantity per unit area) of the conductive traces 136, the redistribution substrate 106 may include a single layer of conductive traces 136 or multiple (e.g., two) layers of conductive traces 136. For example, as shown in FIG. 2, the conductive traces 136 may electrically connect the first redistribution bond pads 132 (and, ultimately through the inner wire bonds 112A, the controller bond pads 128) to the second redistribution bond pads 132 positioned along one lateral edge (e.g., the left lateral edge from the perspective of FIG. 2) of the redistribution substrate 106. However, as noted above, the second redistribution bond pads 132 may be positioned along more than one lateral edge of the redistribution substrate 106.

For example, FIG. 3 illustrates another embodiment of a redistribution substrate 206 that includes first redistribution bond pads 232 for electrical connection to a controller 204 by way of bond wires 212, and second redistribution bond pads 234 positioned along two opposing lateral edges of the redistribution substrate 206 and electrically connected to the respective first redistribution bond pads 234 by conductive traces 236. Such an arrangement of the second redistribution bond pads 234 along more than one lateral edge of the redistribution substrate 206 may provide additional space to enable the second redistribution bond pads 234 to have an increased pitch, such as for ease of manufacturing (e.g., wire bonding). By way of further example, the second redistribution bond pads 234 may be positioned along two adjacent lateral edges, along three lateral edges, or along all four lateral edges of the redistribution substrate 206.

Referring again to FIG. 1, a dielectric material, such as a so-called "film over wire" ("FOW") material 138 may be positioned over the controller 104 and the redistribution substrate 106 and may cover the inner bond wires 112A and at least a portion of the outer bond wires 112B. The FOW material 138, after cure or other solidification, may act as a spacer to physically and electrically separate the controller 104 and the inner and outer bond wires 112A, 112B from the overlying stack 108 of semiconductor memory devices 110. In addition, the FOW material 138 may comprise an adhesive material for adhering the stack 108 of semiconductor memory devices 110 to the controller 104 and the redistribution substrate 106.

The stack 108 of semiconductor memory devices 110 may be positioned over the FOW material 138 and over the controller 104 and the redistribution substrate 106, such that at least a portion of the controller 104 is directly between the interposer 102 and the stack 108. As shown in FIG. 1, in some embodiments, the entire controller 104 may be directly between the interposer 102 and the stack 108. As noted above, the semiconductor memory devices 110 may be NVM memory devices. For example, the semiconductor memory devices 110 may be NAND Flash memory devices. The semiconductor memory devices 110 in the stack 108 may be separated from each other by a dielectric material, such as a dielectric underfill material or a dielectric adhesive. Memory bond pads 140 for electrical access to the integrated circuitry of the semiconductor memory devices 110 may be positioned on a top surface and along one or more lateral side edges of each semiconductor memory device 110 of the stack 108. The memory bond pads 140 may be configured for physical and electrical connection to the memory access wire bonds 112C. In some embodiments, the semiconductor memory devices 110 may be stacked in an offset fashion to provide physical access to the memory bond pads 140. For example, as shown in FIG. 1, each semiconductor memory device 110 may be laterally offset to one side (e.g., to the left side from the perspective shown in FIG. 1) compared to an underlying semiconductor memory device 110, to expose the memory bond pads 140 along a lateral side edge opposite the one side of the underlying semiconductor memory devices 110. In such embodiments, the semiconductor memory devices 110 of the stack 108 may be laterally offset in a single lateral direction, stairstep fashion, and may be electrically connected through the memory access wire bonds 112C using the memory bond pads 140 along one common lateral side of the stack 108 (e.g., the right side of the stack 108, from the perspective of FIG. 1). Laterally offsetting the semiconductor devices 110 of the stack 108 in a single direction may facilitate the formation of the memory access wire bonds 112C. In some embodiments, the semiconductor memory devices 110 may be offset from each other in one or more different directions, depending on the position of the memory bond pads 140 on the underlying semiconductor memory devices 110.

Although the stack 108 of semiconductor memory devices 110 is illustrated in FIG. 1 as including memory bond pads 140 on each of the semiconductor memory devices 110 for electrical connection by way of the memory access wire bonds 112C, the disclosure is not so limited. For example, in other embodiments, the top semiconductor memory device 110 may include memory bond pads 140 electrically connected to memory access wire bonds 112C, while underlying semiconductor memory devices 110 of the stack 108 may be electrically connected to the memory access wire bonds 112C through conductive vias, solder bumps, conductive pillars, etc., extending between the semiconductor memory devices 110 of the stack 108.

Figure 4:
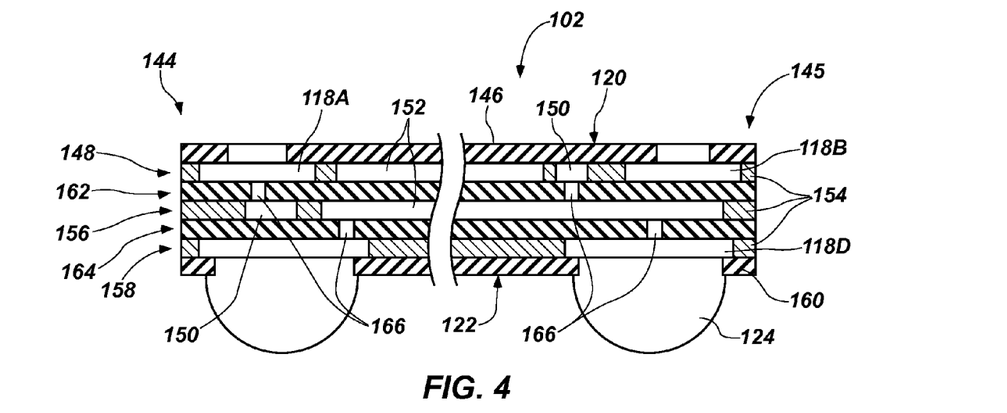
FIG. 4 shows a partial cross-sectional side view of the interposer substrate of the semiconductor device package of FIG. 1.

FIG. 4 shows a partial cross-sectional side view of the interposer 102 of the semiconductor device package 100 (FIG. 1). Referring to FIGS. 1 and 4, the interposer 102 may be a multi-layer substrate configured for routing electrical signals between the conductive bumps 124, controller 104, and semiconductor memory devices 110. The interposer 102 may include the first interposer bond pads 118A for attaching the outer wire bonds 112B to the interposer 102, such as by using conventional wire bonding techniques. The first interposer bond pads 118A may be positioned in a peripheral region of the interposer 102 that is not directly underlying the lowermost semiconductor memory device 110, such as proximate a first lateral edge 144 of the interposer 102. The interposer 102 may also include the second interposer bond pads 118B for attaching the memory access wire bonds 112C to the interposer 102, such as by using conventional wire bonding techniques. The second interposer bond pads 118B may be positioned in another peripheral region of the interposer 102 that is not directly underlying the lowermost semiconductor memory device 110, such as proximate a second lateral edge 145 of the interposer 102. Thus, a central region of the top surface 120 of the interposer 102 directly underlying the lowermost semiconductor memory device 110 may lack bond pads. A first solder mask 146 may be located on the top surface 120 of the interposer 102 to protect internal conductive elements of the interposer 102.

A first routing layer 148 may include the first interposer bond pads 118A, the second interposer bond pads 118B, conductive traces 150 for electrically connecting the first interposer bond pads 118A to the second interposer bond pads 118B, and one or more conductive planar elements 152 that may be continuous or discontinuous. The first routing layer 148 may also include a dielectric material 154 laterally between the first and second interposer bond pads 118A, 118B, conductive traces 150, and one or more conductive planar elements 152. A second routing layer 156 may underlie the first routing layer 148, and may also include conductive traces 150 and one or more conductive planar elements 152 separated by a dielectric material 154. A lower bond pad layer 158 may underlie the second routing layer 156, and may include the fourth interposer bond pads 118D for physical and electrical connection to the conductive bumps 124. A second solder mask 160 may be provided on a bottom surface of the lower bond pad layer 158 to protect internal conductive elements of the interposer 102.

The first routing layer 148 and second routing layer 156 may be separated by a first dielectric barrier layer 162, and the second routing layer 156 and the lower bond pad layer 158 may be separated by a second dielectric barrier layer 164. Conductive vias 166 may electrically connect conductive elements of the first routing layer 148 to conductive elements of the second routing layer 156, and may electrically connect conductive elements of the second routing layer 156 to conductive elements of the lower bond pad layer 158.

The presence of the redistribution substrate 106 laterally adjacent to the controller 104, as described above, may enable the positioning of the first interposer bond pads 118A in a peripheral region of the interposer 102 that is not directly underlying the lowermost semiconductor memory device 110. Compared to semiconductor device packages that include bond pads in a central region of an interposer underlying a stack of semiconductor memory devices, the first interposer bond pads 118A, second interposer bond pads 118B, conductive traces 150 for electrically connecting the first interposer bond pads 118A to the second interposer bond pads 118B, one or more conductive planar elements 152, and conductive vias 166 may have a less complex routing scheme. For example, in semiconductor device packages that include bond pads in a central region of an interposer underlying a stack of semiconductor memory devices, conductive traces and conductive planar elements may need to be rerouted and repositioned to circumvent the central bond pads. Such rerouting and repositioning may result in convoluted electrical pathways and complex routing schemes. Conductive planar elements may be smaller and more fragmented. Therefore, the rerouting and repositioning of the conductive traces and conductive planar elements may add to manufacturing cost, increase a likelihood of failure, and reduce electrical signal integrity. In contrast, the semiconductor device package 100 of this disclosure enables a simplified routing scheme with conductive traces 150 extending from the first interposer bond pads 118A to the second interposer bond pads 118B in a less convoluted fashion. Thus, the one or more conductive planar elements 152 may be relatively large and continuous compared to conductive planar elements in interposer substrates with central bond pads. For these reasons, the semiconductor device package 100 may enable the manufacturing complexity and cost to be reduced and signal integrity to be improved.

The redistribution substrate 106 may also enable the first interposer bond pads 118A to have a larger pitch than if the redistribution substrate 106 were absent and the inner wire bonds 112A directly electrically coupled the controller 104 to the interposer 102 in a location proximate to the controller 104, due to space constraints. The larger pitch of the first interposer bond pads 118A may ease manufacturing constraints and reduce a cost of manufacturing compared to corresponding bond pads arranged at a smaller pitch. In addition, such larger pitch may improve electrical performance of the semiconductor device package 100 by reducing manufacturing and performance defects, such as short circuits and parasitic coupling.

Accordingly, semiconductor device packages are disclosed including a stack of semiconductor memory devices positioned over an interposer substrate. A controller element is positioned directly between the stack of semiconductor memory devices and the interposer substrate. A redistribution substrate is positioned laterally adjacent to the controller element. The controller element is operatively connected to the semiconductor memory devices of the stack through the redistribution substrate and the interposer substrate.

Furthermore, additional embodiments of semiconductor device packages are disclosed that include an interposer substrate, a controller element over the interposer substrate, and semiconductor memory devices stacked over the controller element, such that at least a portion of the controller element is positioned directly between the semiconductor memory devices and the interposer substrate. A redistribution substrate is laterally adjacent to the controller element. At least a portion of the redistribution substrate is positioned directly between the interposer substrate and the semiconductor memory devices. Inner wire bonds electrically connect bond pads of the controller element with respective first bond pads of the redistribution substrate. Outer wire bonds electrically connect bond pads of the interposer substrate with respective second bond pads of the redistribution substrate. The first bond pads of the redistribution substrate are respectively electrically connected to the second bond pads of the redistribution substrate.

FIGS. 5 through 8 illustrate additional embodiments of semiconductor device packages, according to the disclosure, that include one or more semiconductor memory devices in addition to the stack 108 of semiconductor memory devices 110 described above. The one or more additional semiconductor memory devices may be of a different type and configuration compared to the semiconductor memory devices 110 described above. For example, the one or more additional semiconductor memory devices may be one or more volatile memory devices, such as dynamic random access memory ("DRAM") devices.

Figure 5:
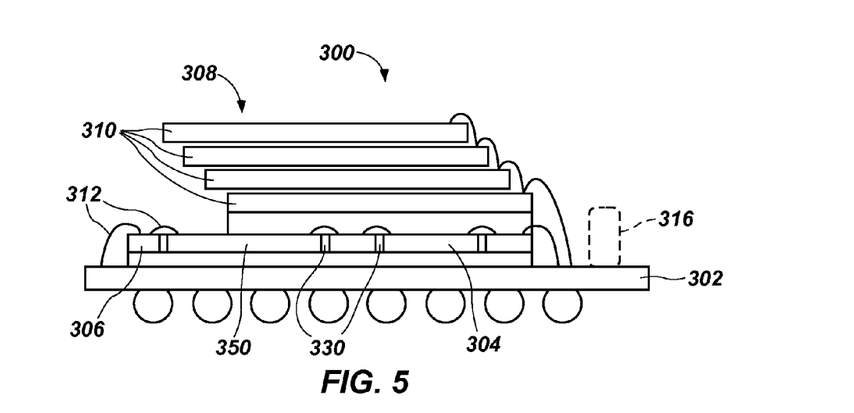
FIG. 5 shows a cross-sectional side view of another embodiment of a semiconductor device package according to the present disclosure.

Referring to FIG. 5, a semiconductor device package 300 may be similar to the semiconductor device package 100 discussed above with reference to FIG. 1, but may further include an additional semiconductor memory device 350 and a modified redistribution substrate 306 and interposer substrate 302 to accommodate the additional semiconductor memory device 350. The semiconductor device package 300 may include the interposer substrate 302, a controller element 304, and a stack 308 of semiconductor memory devices 310 overlying the controller element 304, such that at least a portion of the controller element 304 is positioned directly between the stack 308 and the interposer substrate 302. Optionally, one or more capacitors 316 (shown in FIG. 5 in dashed lines) may be operatively connected to the controller element 304 through the interposer substrate 302. The additional semiconductor memory device 350 (e.g., a DRAM device) may be positioned laterally adjacent to the controller element 304. In some embodiments, at least a portion of the additional semiconductor memory device 350 may be positioned directly between the stack 308 of semiconductor memory devices 310 and the interposer substrate 302. The redistribution substrate 306 may be positioned laterally adjacent to the controller element 304 and the additional semiconductor memory device 350. The redistribution substrate 306 may include one or more cavities 330 (e.g., through holes) sized and configured for receipt of the controller element 304 and the additional semiconductor memory device 350. The additional semiconductor memory device 350 may be operatively electrically connected to the redistribution substrate 306 and, in turn, to the controller element 304 and interposer substrate 302 through wire bonds 312 and conductive traces of the redistribution substrate 306.

Figure 6:
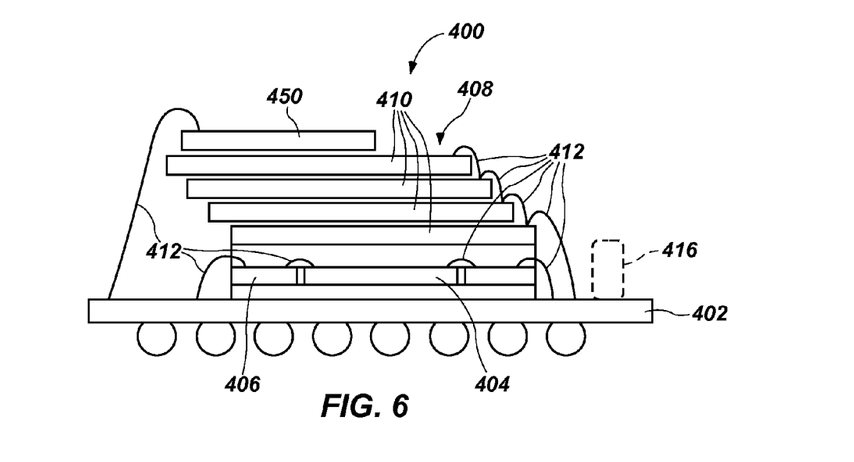
FIG. 6 shows a cross-sectional side view of another embodiment of a semiconductor device package according to the present disclosure.

Referring to FIG. 6, a semiconductor device package 400 may be similar to the semiconductor device package 100 discussed above with reference to FIG. 1, but may further include an additional semiconductor memory device 450 and a modified interposer substrate 402 to accommodate the additional semiconductor memory device 450. The semiconductor device package 400 may include the interposer substrate 402, a controller element 404, a redistribution substrate 406, and a stack 408 of semiconductor memory devices 410 overlying the controller element 404, such that at least a portion of the controller element 404 is positioned directly between the stack 408 and the interposer substrate 402. Optionally, one or more capacitors 416 (shown in FIG. 6 in dashed lines) may be operatively connected to the controller element 404 through the interposer substrate 402. The additional semiconductor memory device 450 (e.g., a DRAM device) may be positioned over the stack 408 of semiconductor memory devices 410, such as over a topmost semiconductor memory device 410 of the stack 408. The additional semiconductor memory device 450 may be operatively electrically connected to the interposer substrate 402 with a wire bond 412, and, in turn, to the controller element 404 through wire bonds 412 and the redistribution substrate 406.

Figure 7:
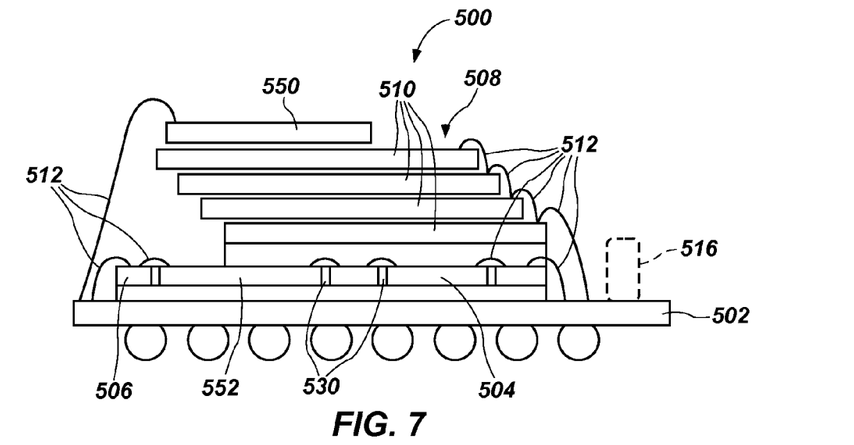
FIG. 7 shows a cross-sectional side view of another embodiment of a semiconductor device package according to the present disclosure.

Referring to FIG. 7, a semiconductor device package 500 may be similar to the semiconductor device package 100 discussed above with reference to FIG. 1, but may further include a first additional semiconductor memory device 550 and a second additional semiconductor memory device 552, as well as a modified interposer substrate 502 to accommodate the first and second additional semiconductor memory devices 550 and 552. The semiconductor device package 500 may include the interposer substrate 502, a controller element 504, a redistribution substrate 506, and a stack 508 of semiconductor memory devices 510 overlying the controller element 504, such that at least a portion of the controller element 504 is positioned directly between the stack 508 and the interposer substrate 502. Optionally, one or more capacitors 516 (shown in FIG. 7 in dashed lines) may be operatively connected to the controller element 504 through the interposer substrate 502. The first additional semiconductor memory device 550 (e.g., a DRAM device) may be positioned over the stack 508 of semiconductor memory devices 510, such as over a topmost semiconductor memory device 510 of the stack 508. The first additional semiconductor memory device 550 may be operatively electrically connected to the interposer substrate 502 with a wire bond 512, and, in turn, to the controller element 504 through wire bonds 512 and the redistribution substrate 506.

The second additional semiconductor memory device 552 (e.g., another DRAM device) may be positioned laterally adjacent to the controller element 504. In some embodiments, at least a portion of the second additional semiconductor memory device 552 may be positioned directly between the stack 508 of semiconductor memory devices 510 and the interposer substrate 502. The redistribution substrate 506 may be positioned laterally adjacent to the controller element 504 and the second additional semiconductor memory device 552. The redistribution substrate 506 may include one or more cavities 530 (e.g., through holes) sized and configured for disposal of the controller element 504 and the second additional semiconductor memory device 552. The second additional semiconductor memory device 552 may be operatively electrically connected to the redistribution substrate 506 and, in turn, to the controller element 504 and interposer substrate 502 through wire bonds 512 and conductive traces of the redistribution substrate 506.

Figure 8:
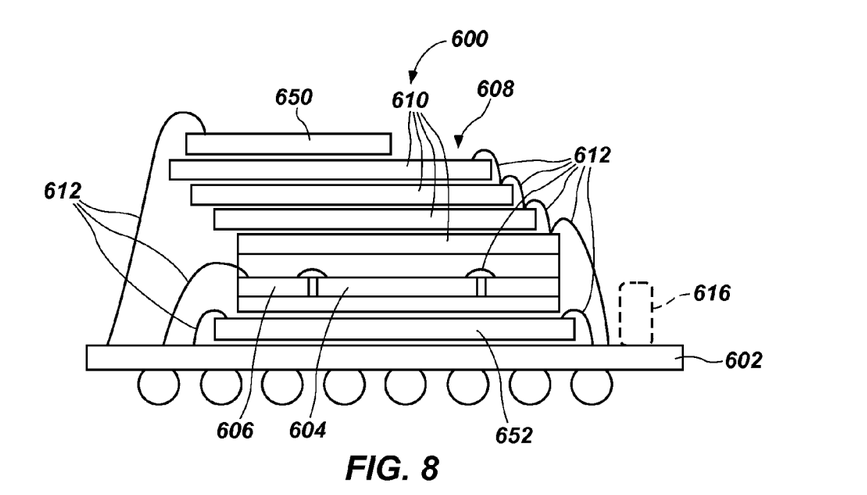
FIG. 8 shows a cross-sectional side view of another embodiment of a semiconductor device package according to the present disclosure.

Referring to FIG. 8, a semiconductor device package 600 may be similar to the semiconductor device package 100 discussed above with reference to FIG. 1, but may further include a first additional semiconductor memory device 650 and a second additional semiconductor memory device 652, as well as a modified interposer substrate 602 to accommodate the first and second additional semiconductor memory devices 650 and 652. The semiconductor device package 600 may include the interposer substrate 602, a controller element 604, a redistribution substrate 606, and a stack 608 of semiconductor memory devices 610 overlying the controller element 604, such that at least a portion of the controller element 604 is positioned directly between the stack 608 and the interposer substrate 602. Optionally, one or more capacitors 616 (shown in FIG. 8 in dashed lines) may be operatively connected to the controller element 604 through the interposer substrate 602. The first additional semiconductor memory device 650 (e.g., a DRAM device) may be positioned over the stack 608 of semiconductor memory devices 610, such as over a topmost semiconductor memory device 610 of the stack 608. The first additional semiconductor memory device 650 may be operatively electrically connected to the interposer substrate 602 with a wire bond 612, and, in turn, to the controller element 604 through wire bonds 612 and the redistribution substrate 606.

The second additional semiconductor memory device 652 (e.g., another DRAM device) may be positioned over the interposer substrate 602 between the controller element 604 and the interposer substrate 602. At least a portion of the second additional semiconductor memory device 652 may extend laterally beyond the overlying redistribution substrate 606 and controller element 604, to enable wire bonds 612 to be coupled between the interposer substrate 602 and a top surface of the second additional semiconductor memory device 652. The second additional semiconductor memory device 652 may be operatively electrically connected to the interposer substrate 602 and, in turn, to the controller element 604 through wire bonds 612 and conductive traces of the redistribution substrate 606.

FIGS. 9 through 13 illustrate an embodiment of a method of manufacturing the semiconductor device package 100 of FIG. 1. Although a particular sequence of operations is shown and described with reference to FIGS. 9 through 13, the present disclosure is not so limited. Indeed, alternative sequences and procedures may be apparent to one of ordinary skill in the art considering the present disclosure, and the sequence described herein is but an example of an embodiment of this disclosure.

Figure 9:
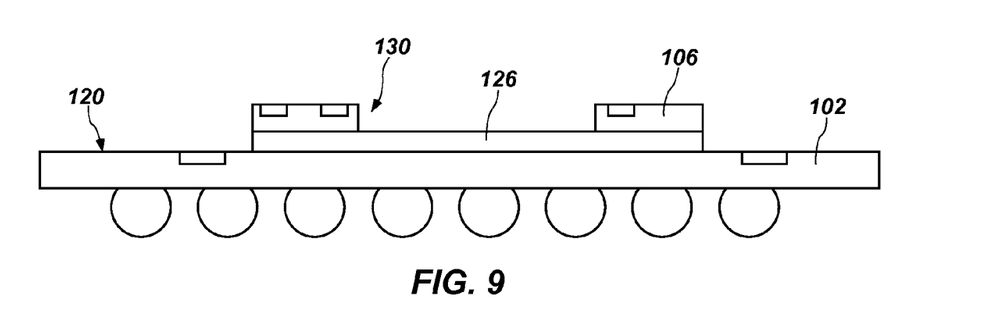
FIGS. 9 through 13 illustrate a method of manufacturing the semiconductor device package of FIG. 1.

Referring to FIG. 9, the redistribution substrate 106 may be adhered to the die attach film 126 residing on the top surface 120 of interposer substrate 102. In some embodiments, the redistribution substrate 106 and the die attach film 126 may together be attached to the top surface 120 of the interposer substrate 102.

Figure 10:
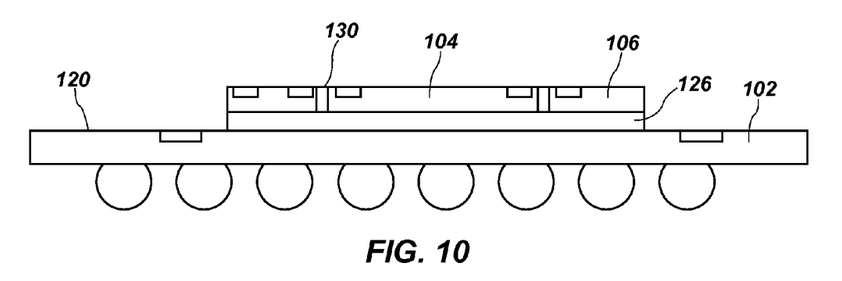

Referring to FIG. 10, the controller element 104 may be positioned within the cavity 130 (e.g., through hole) of the redistribution substrate 106 and may be adhered to the die attach film 126. In other embodiments, the controller element 104 may be adhered to the die attach film 126 prior to or after the redistribution substrate 106 is adhered to the die attach film 126, and prior to attaching the interposer substrate 102 to an opposing side of the die attach film 126.

Figure 11:
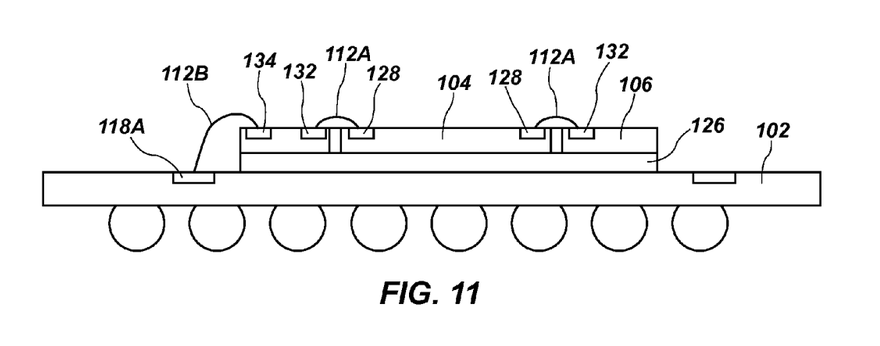

Referring to FIG. 11, the inner wire bonds 112A may be operatively connected to the controller bond pads 128 and the first redistribution bond pads 132. The outer wire bonds 112B may be operatively connected to the second redistribution bond pads 134 and the first interposer bond pads 118A.

Figure 12:
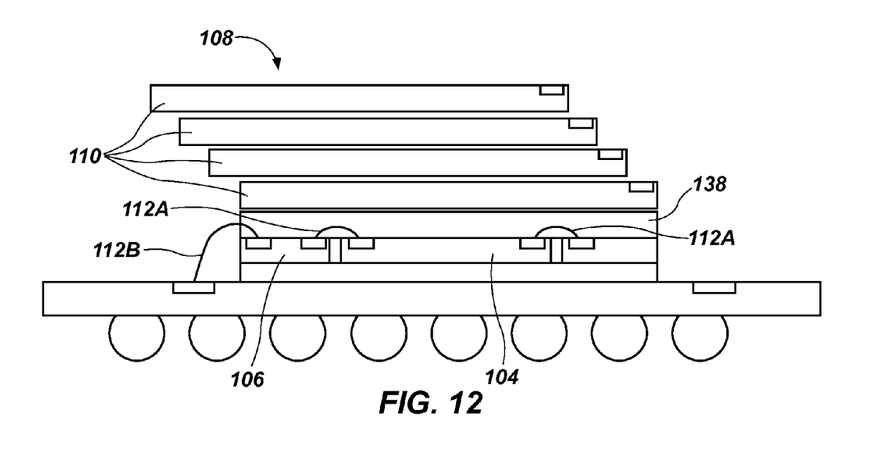

Next, as shown in FIG. 12, the FOW material 138 may be positioned over the controller element 104, the redistribution substrate 106, the inner bond wires 112A, and at least a portion of the outer bond wires 112B. The stack 108 of semiconductor memory devices 110 may be positioned over and attached to the FOW material 138 after solidification. In some embodiments, the stack 108 may be pre-assembled and then attached as a unit to the FOW material 138. In other embodiments, the semiconductor memory devices 110 of the stack 108 may be positioned over the FOW material 138 one-by-one to form the stack 108.

Figure 13:
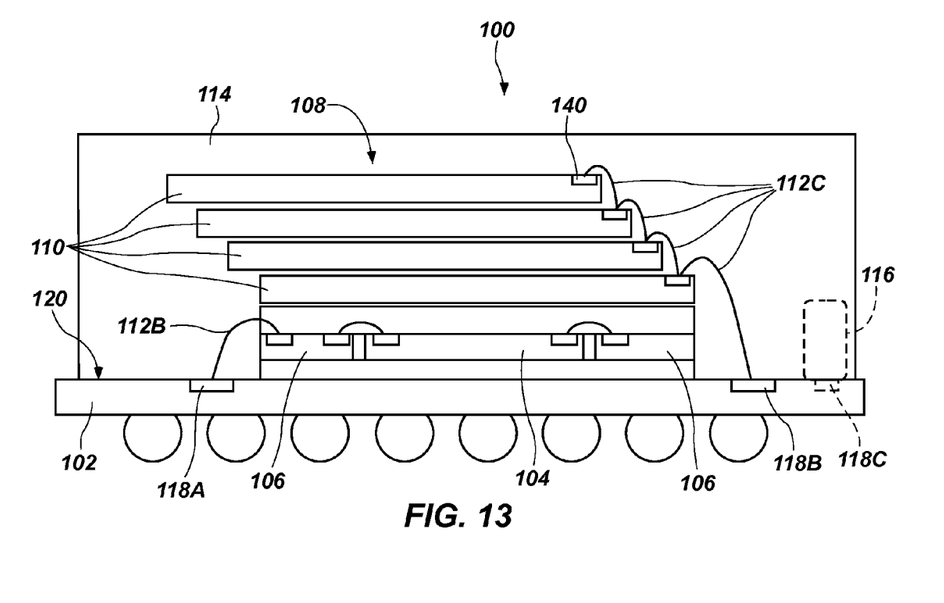

Referring to FIG. 13, in embodiments including the at least one capacitor 116, the at least one capacitor 116 (shown in FIG. 13 in dashed lines) may be coupled to the interposer substrate 102 and electrically connected to the at least one third interposer bond pad 118C. The memory access bond wires 112C may be operatively connected to the second interposer bond pads 118B and the memory bond pads 140 of the semiconductor memory devices 110 of the stack 108. The dielectric encapsulant 114 may be formed, as by molding, over the top surface 120 of the interposer 102 to at least substantially cover the stack 108 of semiconductor memory devices 110, the outer bond wires 112B, the controller element 104, the redistribution substrate 106, the first interposer bond pads 118A, the second interposer bond pads 118B, and, optionally, the at least one capacitor 116.

Accordingly, methods of manufacturing a semiconductor device package that includes a controller element and a stack of semiconductor memory devices are disclosed. In accordance with such methods, a redistribution substrate is positioned laterally adjacent to a controller element. The redistribution substrate and the controller element are attached to an interposer substrate. A stack of semiconductor memory devices are positioned over the controller element and the redistribution substrate, such that at least a portion of the controller element is directly between the stack of semiconductor memory devices and the interposer substrate. The controller element is operatively connected to the semiconductor memory devices of the stack through the redistribution substrate and the interposer substrate.

The embodiments of the disclosure described above and illustrated in the accompanying drawing figures do not limit the scope of the invention, since these embodiments are merely examples of embodiments of the disclosure. The invention is encompassed by the appended claims and their legal equivalents. Any equivalent embodiments lie within the scope of this disclosure. Indeed, various modifications of the present disclosure, in addition to those shown and described herein, such as other combinations and modifications of the elements described, will become apparent to those of ordinary skill in the art from the description. Such embodiments, combinations, and modifications also fall within the scope of the appended claims and their legal equivalents.

What is claimed is:

1. A semiconductor device package, comprising:
   a stack of semiconductor memory devices positioned over an interposer substrate;
   a controller element positioned directly between the stack of semiconductor memory devices and the interposer substrate; and a redistribution substrate positioned laterally adjacent to the controller element,
wherein the controller element is operatively connected to the semiconductor memory devices of the stack through the redistribution substrate and the interposer substrate.

2. The semiconductor device package of claim 1, wherein the redistribution substrate laterally surrounds the controller element.

3. The semiconductor device package of claim 1, wherein the redistribution substrate comprises a through hole, and the controller element is positioned within the through hole.

4. The semiconductor device package of claim 1, wherein a thickness of the redistribution substrate is substantially the same as a thickness of the controller element.

5. The semiconductor device package of claim 1, wherein the semiconductor memory devices of the stack comprise non-volatile memory devices, and the semiconductor device package further comprises at least one volatile memory device.

6. The semiconductor device package of claim 5, wherein at least a portion of the at least one volatile memory device is positioned directly between the interposer substrate and the non-volatile memory devices.

7. The semiconductor device package of claim 6, wherein the at least one volatile memory device is positioned laterally adjacent to the controller element.

8. The semiconductor device package of claim 6, wherein at least a portion of the at least one volatile memory device is positioned directly between the interposer substrate and the controller element.

9. The semiconductor device package of claim 6, wherein the at least one volatile memory device comprises a first volatile memory device and a second volatile memory device.

10. The semiconductor device package of claim 9, wherein the second volatile memory device is positioned on top of the non-volatile memory devices.

11. The semiconductor device package of claim 1, further comprising at least one capacitor operatively connected to the controller element through the interposer substrate and the redistribution substrate.

12. A semiconductor device package, comprising:
an interposer substrate;
a controller element over the interposer substrate;
semiconductor memory devices stacked over the controller element, such that at least a portion of the controller element is positioned directly between the semiconductor memory devices and the interposer substrate;
a redistribution substrate laterally adjacent to the controller element, at least a portion of the redistribution substrate being positioned directly between the interposer substrate and the semiconductor memory devices;
inner wire bonds electrically connecting bond pads of the controller element with respective first bond pads of the redistribution substrate; and
outer wire bonds electrically connecting bond pads of the interposer substrate with respective second bond pads of the redistribution substrate, the first bond pads of the redistribution substrate being respectively electrically connected to the second bond pads of the redistribution substrate.

13. The semiconductor device package of claim 12, wherein the redistribution substrate has an outer peripheral size and shape that is substantially the same as an outer peripheral size and shape of at least one semiconductor memory device of the stack.

14. The semiconductor device package of claim 12, wherein the second bond pads of the redistribution substrate have a pitch that is greater than a pitch of the bond pads of the controller element.

15. The semiconductor device package of claim 12, further comprising memory access wire bonds electrically connecting additional bond pads of the interposer substrate with respective memory bond pads of the semiconductor memory devices, wherein the bond pads of the interposer substrate to which the outer wire bonds are electrically connected are positioned in a region of the interposer substrate proximate a first lateral edge of the interposer substrate and the additional bond pads of the interposer substrate to which the memory access wire bonds are electrically connected are positioned in a region of the interposer substrate proximate a second, opposite lateral edge of the interposer substrate.

16. The semiconductor device package of claim 15, wherein the semiconductor memory devices are stacked to be laterally offset from one another in a single direction, and the memory bond pads of the semiconductor memory devices are along a common lateral side of each respective semiconductor memory device of the semiconductor memory devices.

* * * * *

UNITED STATES PATENT AND TRADEMARK OFFICE
CERTIFICATE OF CORRECTION

PATENT NO. : 9,761,562 B2
APPLICATION NO. : 14/705274
DATED : September 12, 2017
INVENTOR(S) : Seng Kim Dalson Ye and Hong Wan Ng It is certified that error appears in the above-identified patent and that said Letters Patent is hereby corrected as shown below:

In the Specification

Column 3, Line 52, change "Timer wire" to --Inner wire--

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*